United States Patent
Lee

(10) Patent No.: US 8,759,140 B2
(45) Date of Patent: Jun. 24, 2014

(54) SOLAR CELL AND METHOD FOR MANUFACTURING THE SAME

(71) Applicant: LG Electronics Inc., Seoul (KR)

(72) Inventor: Seongeun Lee, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 13/728,604

(22) Filed: Dec. 27, 2012

(65) Prior Publication Data

US 2013/0122635 A1    May 16, 2013

Related U.S. Application Data

(62) Division of application No. 12/533,892, filed on Jul. 31, 2009, now abandoned.

(30) Foreign Application Priority Data

Aug. 1, 2008  (KR) ........................ 10-2008-0075780

(51) Int. Cl.
  *H01L 31/18*  (2006.01)
(52) U.S. Cl.
  USPC ........................................... 438/72
(58) Field of Classification Search
  None
  See application file for complete search history.

(56) References Cited

U.S. PATENT DOCUMENTS

| 4,994,879 A | 2/1991 | Hayashi |
| 5,131,933 A * | 7/1992 | Flodl et al. .................... 136/256 |
| 6,093,882 A | 7/2000 | Arimoto |
| 6,150,190 A | 11/2000 | Stankus et al. |
| 6,165,598 A | 12/2000 | Nelson |
| 6,274,514 B1 | 8/2001 | Jang et al. |
| 6,586,102 B1 | 7/2003 | Stachowiak |
| 2003/0043464 A1* | 3/2003 | Dannenberg .................. 359/585 |
| 2003/0168658 A1 | 9/2003 | Fukushima et al. |
| 2005/0178431 A1 | 8/2005 | Yang et al. |
| 2006/0096537 A1 | 5/2006 | Tuttle |
| 2006/0105103 A1* | 5/2006 | Hartig ........................... 427/209 |
| 2006/0130891 A1* | 6/2006 | Carlson ......................... 136/256 |

(Continued)

FOREIGN PATENT DOCUMENTS

| CN | 101179700 A | 5/2008 |
| DE | 10 2006 046 726 A1 | 4/2008 |

(Continued)

OTHER PUBLICATIONS

English machine translation of Cho et al.; KR 10-0416741, published May 2004.

(Continued)

*Primary Examiner* — Charles Garber
*Assistant Examiner* — Stanetta Isaac
(74) *Attorney, Agent, or Firm* — Birch, Stewart, Kolasch & Birch, LLP

(57) ABSTRACT

The present invention relates to a solar cell. The solar cell includes a substrate of a first conductive type, an emitter layer of a second conductive type opposite the first conductive type on the substrate, first and second anti-reflection layers that are sequentially positioned on the emitter layer, a first electrode electrically connected to the emitter layer, first to third passivation layers that are sequentially positioned on the substrate, each of the first to third passivation layers including a plurality of exposed portions, and a plurality of second electrodes electrically connected to portions of the substrate exposed by the plurality of exposed portions.

6 Claims, 6 Drawing Sheets

(56) References Cited

U.S. PATENT DOCUMENTS

| | | |
|---|---|---|
| 2006/0197096 A1 | 9/2006 | Kerdiles et al. |
| 2006/0255340 A1 | 11/2006 | Manivannan et al. |
| 2007/0137699 A1 | 6/2007 | Manivannan et al. |
| 2007/0175508 A1* | 8/2007 | Park .................... 136/256 |
| 2007/0186970 A1* | 8/2007 | Takahashi et al. ...... 136/255 |
| 2008/0224157 A1 | 9/2008 | Slater |
| 2009/0056798 A1* | 3/2009 | Merchant et al. ....... 136/256 |
| 2009/0223560 A1* | 9/2009 | Kim ..................... 136/256 |
| 2009/0260685 A1* | 10/2009 | Lee et al. .............. 136/256 |

FOREIGN PATENT DOCUMENTS

| | | |
|---|---|---|
| EP | 1 906 455 A1 | 4/2008 |
| JP | 2-143569 A | 6/1990 |
| JP | 5-129277 A | 5/1993 |
| JP | 5-259495 A | 10/1993 |
| JP | 10-4204 A | 1/1998 |
| JP | 2003-231969 A | 8/2003 |
| JP | 2003-273385 A | 9/2003 |
| JP | 2007-505771 A | 3/2007 |
| JP | 2007-266327 A | 10/2007 |
| JP | 2007-310335 A | 11/2007 |
| JP | 2008-135565 A | 6/2008 |
| KR | 10-0416740 B1 | 5/2004 |
| KR | 10-0416741 B1 | 5/2004 |
| KR | 10-2005-0087253 A | 8/2005 |
| KR | 10-2005-0098472 A | 10/2005 |
| KR | 10-2005-0100806 A | 10/2005 |
| KR | 10-2008-0062515 A | 7/2008 |
| WO | WO 2004/036658 A1 | 4/2004 |
| WO | WO 2008/039067 A2 | 4/2008 |

OTHER PUBLICATIONS

J. Dupuis et al., "Impact of PECVD SiON stoichiometry and post-annealing on the silicon surface passivation", Thin Solid Films, Science Direct, vol. 516, No. 40, 2008 (available online Jan. 22, 2008), pp. 6954-6958.

\* cited by examiner

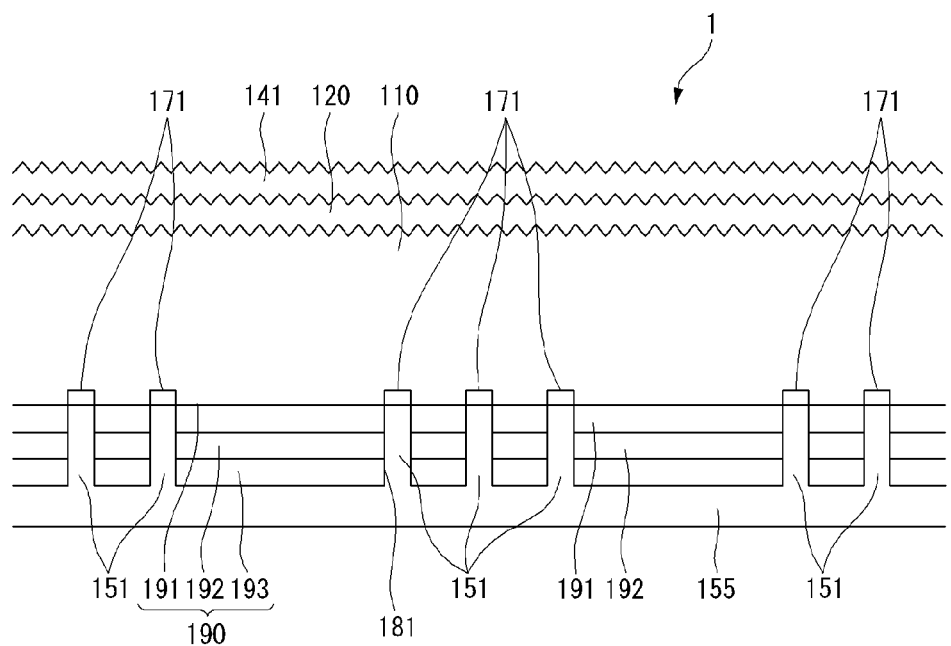

FIG. 3A
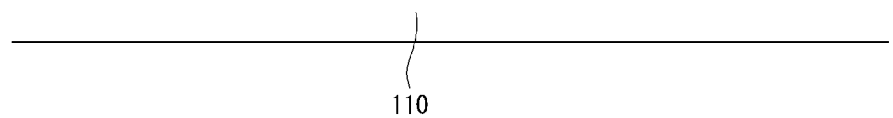
110
FIG. 3B
120
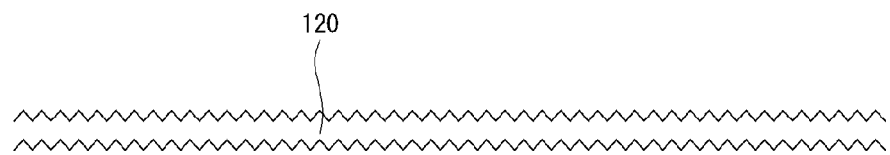
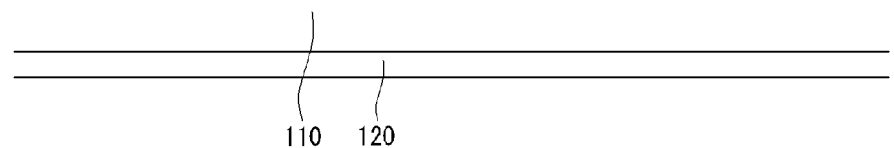
110  120
FIG. 3C
120
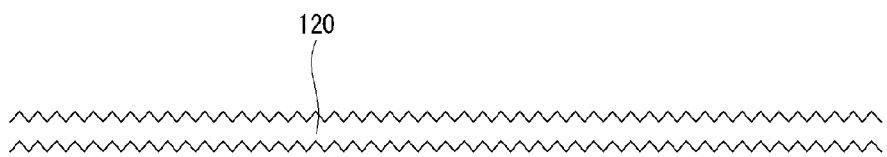
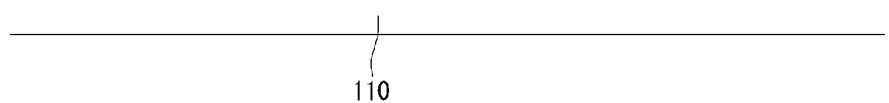
110

SOLAR CELL AND METHOD FOR MANUFACTURING THE SAME

CROSS-REFERENCE TO RELATED APPLICATION

This application is a Divisional of copending application Ser. No. 12/533,892 filed on Jul. 31, 2009, which claims priority to Application No. 10-2008-0075780 filed in KR, on Aug. 1, 2008. The entire contents of all of the above applications is hereby incorporated by reference.

BACKGROUND OF THE INVENTION

1. Field of the Invention

Embodiments of the present invention relate to a solar cell and a method for manufacturing the same.

2. Description of the Related Art

Recently, as existing energy sources such as petroleum and coal are expected to be depleted, interests in alternative energy sources for replacing the existing energy sources are increasing. Among the alternative energy sources, solar cells have been particularly spotlighted because, as cells for generating electric energy from solar energy, the solar cells are able to draw energy from an abundant source and do not cause environmental pollution. A general solar cell includes a substrate and an emitter layer, formed of a semiconductor, each having a different conductive type such as a p-type and an n-type, and electrodes respectively formed on the substrate and the emitter layer. The general solar cell also includes a p-n junction formed at an interface between the substrate and the emitter layer.

When light is incident on the solar cell, a plurality of electron-hole pairs are generated in the semiconductor. Each of the electron-hole pairs is separated into electrons and holes by the photovoltaic effect. Thus, the separated electrons move to the n-type semiconductor (e.g., the emitter layer) and the separated holes move to the p-type semiconductor (e.g., the substrate), and then the electrons and holes are collected by the electrodes electrically connected to the emitter layer and the substrate, respectively. The electrodes are connected to each other using electric wires to thereby obtain an electric power.

SUMMARY OF THE INVENTION

According to an aspect of the present invention, a method of forming an electrode of a solar cell includes selectively forming a passivation layer exposing at least a portion of a substrate on a portion of the substrate including an emitter layer, the passivation layer including at least one layer, forming a first electrode electrically connected to the emitter layer, and forming a plurality of second electrodes on the exposed portion of the substrate to electrically connect the plurality of second electrodes to the substrate.

The passivation layer may be formed on a surface of the substrate on which light is not incident.

The forming of the passivation layer may include positioning a mask including a plurality of openings and a plurality of blocking portions on the substrate, and forming a layer on portions of the substrate facing the openings and forming a plurality of exposed portions of the substrate facing the blocking portions to form the passivation layer including the plurality of posing portions, wherein the plurality of second electrodes are electrically connected to the substrate through the plurality of posing portions.

According to another aspect of the present invention, a solar cell includes a substrate of a first conductive type, an emitter layer of a second conductive type opposite the first conductive type on the substrate, first and second anti-reflection layers that are sequentially positioned on the emitter layer, a first electrode electrically connected to the emitter layer, first to third passivation layers that are sequentially positioned on the substrate, each of the first to third passivation layers including a plurality of exposed portions, and a plurality of second electrodes electrically connected to portions of the substrate exposed by the plurality of exposed portions.

The first anti-reflection layer may be formed of silicon nitride (SiNx:H), and the second anti-reflection layer may be formed of silicon oxynitride (SiOxNy).

A refractive index of the first anti-reflection layer may be greater than a refractive index of the second anti-reflection layer.

The first anti-reflection layer may have a refractive index of about 2.2 to 2.6, and the second anti-reflection layer may have a refractive index of about 1.3 to 1.6.

The first passivation layer may be formed of silicon oxide ($SiO_x$), the second passivation layer may be formed of silicon nitride (SiNx:H), and the third passivation layer may be formed of silicon oxynitride (SiOxNy).

The first passivation layer may have a maximum refractive index, and the third passivation layer may have a minimum refractive index.

A thickness of the first electrode may be greater than a sum of thicknesses of the first and second anti-reflection layers.

According to further another aspect of the present invention, a method for manufacturing a solar cell includes forming an emitter layer of a second conductive type opposite a first conductive type on a substrate of the first conductive type, sequentially positioning the substrate in a plurality of chambers to form an anti-reflection layer on the emitter layer and to form a passivation layer including at least one exposed portion on a rear surface of the substrate opposite an incident surface of the substrate, coating a first paste on the anti-reflection layer to form a first electrode pattern, coating a second paste on the passivation layer and on a portion of the substrate exposed by the exposed portion to form a second electrode conductive layer pattern, and performing a thermal process on the substrate having the first electrode pattern and the second electrode conductive layer pattern to form a plurality of first electrodes electrically connected to the emitter layer and to form a second electrode conductive layer including at least one second electrode electrically connected to the substrate.

A number of chambers may be equal to a sum of a number of layers constituting the anti-reflection layer and a number of layers constituting the passivation layer, wherein a different source gas may be injected into each of the plurality of chambers.

The anti-reflection layer may include first and second anti-reflection layers each having a different refractive index.

The first anti-reflection layer may be formed of silicon nitride (SiNx:H), and the second anti-reflection layer may be formed of silicon oxynitride (SiOxNy).

The passivation layer may include first, second, and third passivation layers each having a different refractive index.

The first passivation layer positioned closest to the substrate may have a maximum refractive index, and the third passivation layer positioned farthest away from the substrate may have a minimum refractive index.

The first passivation layer may be formed of silicon oxide ($SiO_x$), the second passivation layer may be formed of silicon nitride (SiNx:H), and the third passivation layer may be formed of silicon oxynitride (SiOxNy).

The forming of the anti-reflection layer and the passivation layer may include independently performing a layer formation process in each of the plurality of chambers.

The forming of the anti-reflection layer and the passivation layer may include positioning a mask including at least one opening and at least one blocking portion on the substrate and performing the layer formation process on the substrate using the mask to form the first, second, and third passivation layers, wherein the same mask may be used to form the first, second, and third passivation layers.

The layer formation process may use a chemical vapor deposition (CVD) method.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIG. 2 is a cross-sectional view taken along the line II-II of FIG. 1;

FIGS. 3A to 3F are cross-sectional views sequentially showing each of steps in a method for manufacturing a solar cell according to an exemplary embodiment of the present invention.

DETAILED DESCRIPTION OF THE EMBODIMENTS

Figure 1:
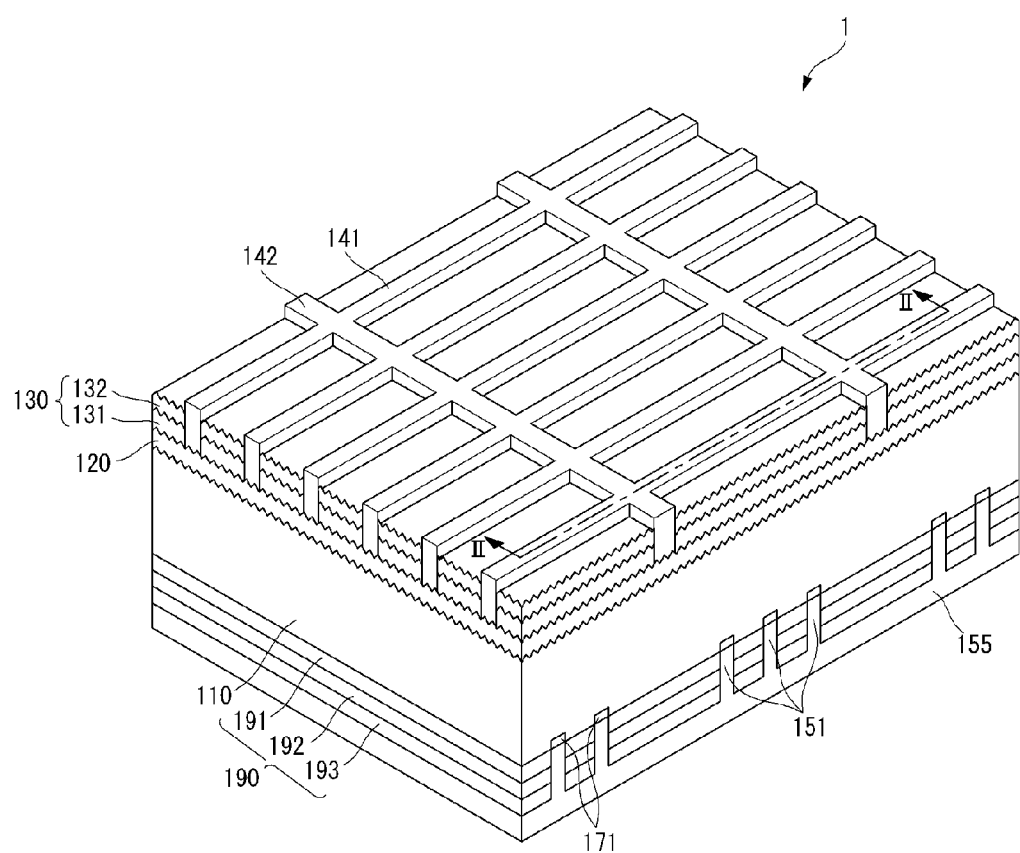
FIG. 1 is a partial perspective view of a solar cell according to an exemplary embodiment of the present invention.

The invention will be described more fully hereinafter with reference to the accompanying drawings, in which example embodiments of the inventions are shown. This invention may, however, be embodied in many different forms and should not be construed as limited to the embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Now, referring to the drawings, a solar cell and a method for manufacturing the solar cell according to an exemplary embodiment of the present invention will be described.

First, a solar cell according to an exemplary embodiment of the present invention will be described with reference to FIGS. 1 and 2.

FIG. 1 is a partial perspective view of a solar cell according to an exemplary embodiment of the present invention and FIG. 2 is a cross-sectional view taken along the line II-II of FIG. 1.

Referring to FIG. 1, a solar cell 1 according to an exemplary embodiment includes a substrate 110, an emitter layer 120 on an incident surface (hereinafter, referred to as "a front surface") of the substrate 110, on which light is incident, an anti-reflection layer 130 on the emitter layer 120, a passivation layer 190 on a rear surface of the substrate 110 opposite the front surface of the substrate 110, a plurality of front electrodes 141 electrically connected to the emitter layer 120, a plurality of front electrode current collectors 142, a rear electrode conductive layer 155, and a plurality of back surface fields (BSFs) 171. The plurality of front electrode current collectors 142 are connected to the plurality of front electrodes 141 and extend in a direction intersecting the front electrodes 141. The rear electrode conductive layer 155 is positioned on the passivation layer 190 and includes a plurality of rear electrodes 151 electrically connected to the substrate 110. The plurality of BSFs 171 are positioned between the substrate 110 and the plurality of rear electrodes 151.

In the example embodiment, the substrate 110 may be formed of silicon doped with impurities of a first conductive type, for example, a p-type, though not required. Examples of silicon include single crystal silicon, polycrystalline silicon, and amorphous silicon. When the substrate 110 is of a p-type, the substrate 110 contains impurities of a group III element such as boron (B), gallium (Ga), and Indium (In). Alternatively, the substrate 110 may be of an n-type, and/or be made of materials other than silicon. When the substrate 110 is of the n-type, the substrate 110 may contain impurities of a group V element such as phosphor (P), arsenic (As), and antimony (Sb).

The surface of the substrate 110 is textured to form a textured surface corresponding to an uneven surface.

The emitter layer 12 is positioned on the incident surface and side portions of the substrate 110. The emitter layer 120 is an impurity portion having a second conductive type (for example, an n-type) opposite to the first conductive type of the substrate 110. The emitter layer 120 and the substrate 110 form a p-n junction.

A plurality of electron-hole pairs produced by light incident on the substrate 110 are separated into electrons and holes by a built-in potential difference resulting from the p-n junction. Then, the separated electrons move toward the n-type semiconductor, and the separated holes move toward the p-type semiconductor. Thus, when the substrate 110 is the p-type and the emitter layer 120 is the n-type, the separated holes move to the substrate 110 and the separated electrons move to the emitter layer 120. Accordingly, the holes in the substrate 110 and the electrons in the emitter layer 120 become major carriers.

Because the substrate 110 and the emitter layer 120 form the p-n junction, the emitter layer 120 may be of the p-type when the substrate 110 is of the n-type unlike the embodiment described above. In this case, the separated electrons move to the substrate 110 and the separated holes move to the emitter layer 120.

Returning to the embodiment in which the emitter layer 120 is of the n-type, the emitter layer 120 may be formed by doping the substrate 110 with impurities of a group V element such as P, As, and Sb. On the contrary, when the emitter layer 120 is of the p-type, the emitter layer 120 may be formed by doping the substrate 110 with impurities of a group III element such as B, Ga, and In.

The anti-reflection layer 130 is formed on the emitter layer 120 positioned on the front surface of the substrate 110. The anti-reflection layer 130 includes a first anti-reflection layer 131 and a second anti-reflection layer 132. In this embodiment, the first anti-reflection layer 131 is made of silicon nitride (SiNx:H) and the second anti-reflection layer 132 is made of silicon oxynitride (SiOxNy). At this time, x and y may be larger than "0" and less than "1".

Light reflected from the second anti-reflection layer 132 and the first anti-reflection layer 131 generates a destructive interface, to decrease a reflectance of light and increase selectivity at a predetermined wavelength of light. Further, the first and second anti-reflection layers 131 and 132 changes unstable bonds such as dangling bonds existing near the surface of the emitter layer 120 into stable bonds, to decrease a disappearance of the charges moved toward the emitter layer 120 due to the unstable bonds.

As described above, when a range of x and y is larger than "0" and less than "1", an amount of the destructive interface increases.

For the above-described functions of the first and second anti-reflection layers 131 and 132, the first anti-reflection layer 131 has a refractive index of about 2.2 to 2.6 and the second anti-reflection layer 132 has a refractive index of about 1.3 to 1.6. That is, the refractive index of the first anti-reflection layer 131 is more than that of the second anti-reflection layer 132.

The plurality of front electrodes 141 are positioned on the emitter layer 120 and are electrically connected to the emitter layer 120. The plurality of front electrodes 141 are spaced apart from each other and extend in a predetermined direction. The front electrodes 141 collect charges (for example, electrons) moved to the emitter layer 120.

The plurality of front electrode current collectors 142 are positioned on the same level layer as the first electrodes 141 on the emitter layer 120 and extend in a direction intersecting the front electrodes 141. The front electrode current collectors 142 collect the charges transferred from the front electrodes 141 and output the charges to an external device.

The front electrodes 141 and the front electrode current collectors 142 are made of at least one conductive material. An example of the conductive materials may be at least one selected from the group consisting of nickel (Ni), copper (Cu), silver (Ag), aluminum (Al), tin (Sn), zinc (Zn), indium (In), titanium (Ti), gold (Au), and a combination thereof, but may be other conductive materials.

The passivation layer 190 is positioned on the rear surface of the substrate 110. The passivation layer 190 includes a plurality of exposed portions 181, through which portions of the substrate 110 are exposed. The passivation layer 190 includes first to third passivation layers 191-193 that are sequentially positioned over the substrate 110.

In this embodiment, the first passivation layer 191 is made of silicon oxide (SiOx), the second anti-reflection layer 192 is made of silicon nitride (SiNx:H), and the third anti-reflection layer 193 is made of silicon oxynitride (SiOxNy). At this time, x and y are larger than "0" and less than "1", respectively.

The respective first to third passivation layers have a reflective index that is higher depending on how close each of them are to the substrate 110. Thereby, light passing through the substrate 110 is easily re-incident toward the substrate 110. As a result, the first passivation layer 191 positioned on the substrate 110 has the largest refractive index, and the third passivation layer 193 positioned farthest away from the substrate 110 has the smallest refractive index.

Further, the passivation layer 190 reduces the recombination of the charges near the surface of the substrate 110. That is, the passivation layer 190 converts the unstable bonds such as the dangling bonds existing near the surface of the substrate 110 into the stable bonds, so as to decrease the disappearance of the charges moved to the substrate 110, due to the unstable bonds.

The rear electrode conductive layer 155 is made of a conductive material and is positioned on the passivation layer 190 and portions of the substrate 110 exposed through the plurality of exposed portions 181.

The rear electrode conductive layer 155 includes the plurality of rear electrodes 151 electrically connected to the exposed portions of the substrate 110.

The rear electrodes 151 collect charges (for example, holes) moved to the substrate 110 and transfer the collected charges to the rear electrode conductive layer 155. Thereby, the rear electrode conductive layer 155 output the charges transferred from the rear electrodes 151 to the external device.

The conductive material may be at least one selected from the group consisting of nickel (Ni), copper (Cu), silver (Ag), aluminum (Al), tin (Sn), zinc (Zn), indium (In), titanium (Ti), gold (Au), and a combination thereof. Other conductive materials may be used.

The plurality of BSFs 171 are positioned between the rear electrodes 151 and the substrate 110. The BSFs 171 are areas (for example, p+-type areas) that are more heavily doped with impurities of the same conductive type as the substrate 110 than the substrate 110.

A potential barrier is formed due to an impurity doped concentration difference from the substrate 110 and each of the BSFs 171, and thereby, the movement of the electrons to the rear surface of the substrate 110 is disturbed by the potential barrier. Accordingly, the BSFs 171 prevent or reduce the recombination and/or the disappearance of the electrons and holes near the rear surface of the substrate 110.

An operation of the solar cell 1 of the above-described structure according to the exemplary embodiment of the present invention will be described.

When light irradiated to the solar cell 1 is incident on the substrate 110 through the anti-reflection layer 130 and the emitter layer 120, a plurality of electron-hole pairs are generated in the substrate 110 by light energy based on the incident light.

At this time, since the substrate 110 has the textured surface, the reflectance of light from the incident surface of the substrate 110 decreases, and the light is confined within the solar cell 1 through the incident and reflection operations on the textured surface. Accordingly, the absorption of light is increased, and thereby the efficiency of the solar cell 1 is improved.

In addition, a reflection loss of light incident toward the substrate 110 is reduced by the anti-reflection layer 130, and thus an amount of light incident toward the substrate 110 further increases.

The electron-hole pairs are separated by the p-n junction of the substrate 110 and the emitter layer 120, and the separated electrons move to the n-type emitter layer 120 and the separated holes move to the p-type substrate 110. The electrons moved to the n-type emitter layer 120 are collected by the front electrodes 141 and then are transferred to the front electrode current collectors 142. The holes moved to the p-type substrate 110 are collected by the rear electrodes 151 and then are transferred to the rear electrode conductive layer 155. When the front electrode current collectors 142 are connected to the rear electrode conductive layer 155 using electric wires (not shown), current flows therethrough to thereby enable use of the current for electric power.

At this time, since the unstable bonds such as the dangling bonds existing near the front and rear surfaces of the substrate 110 are converted into the stable bonds by the first and second anti-reflection layers 131 and 132 positioned on the front surface of the substrate 110 and the first to third passivation layers 191-193 positioned on the rear surface of the substrate 110, a surface state of the substrate 110 becomes a passivated state. Accordingly, the recombination is largely reduced, which the electrons and holes moved toward the emitter layer 120 and the substrate 110, respectively, are combined with the unstable bonds to disappear, and thereby the efficiency of the solar cell 1 is remarkably improved.

Next, referring to FIGS. 3A to 3F, and FIGS. 4A and 4B, a method for manufacturing the solar cell 1 according to the exemplary embodiment of the preset invention will be described.

Figure 3D:
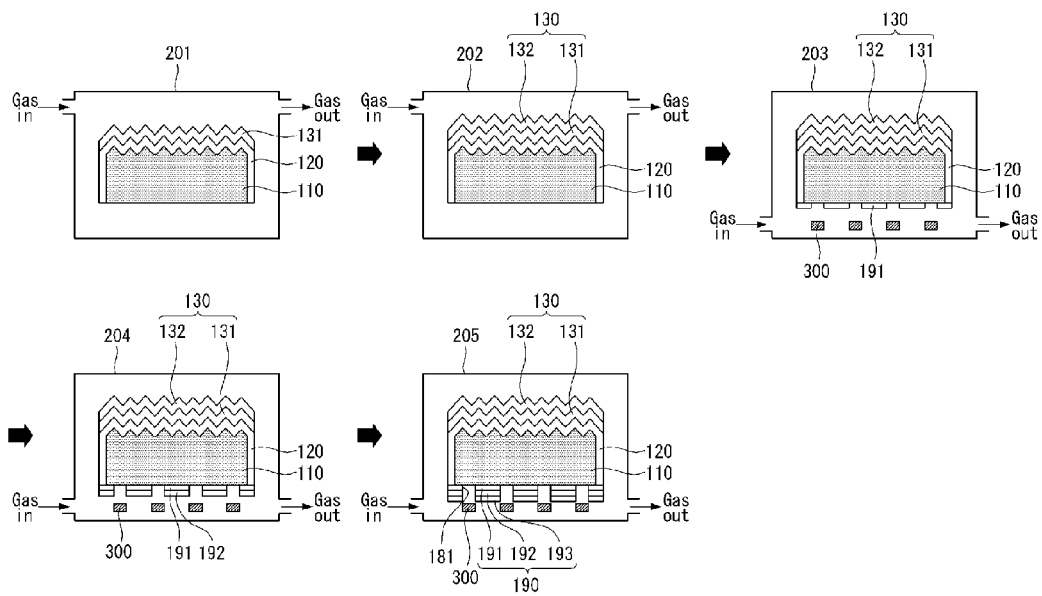
Figure 3E:
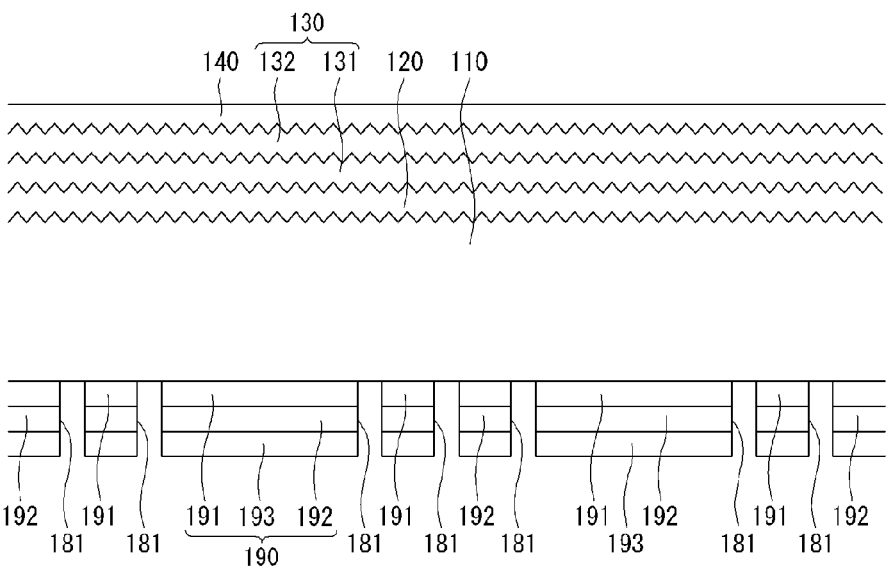
Figure 3F:
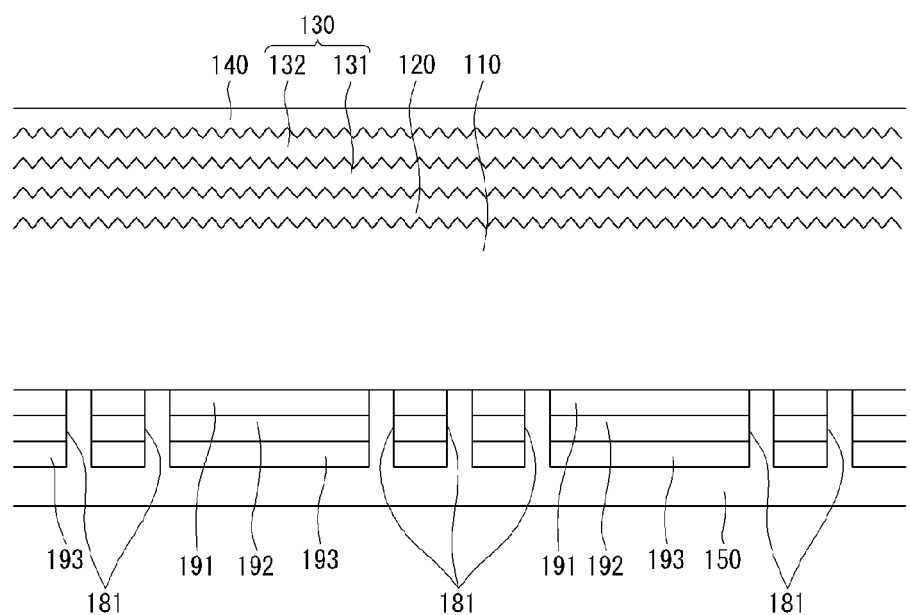
Figure 4A:
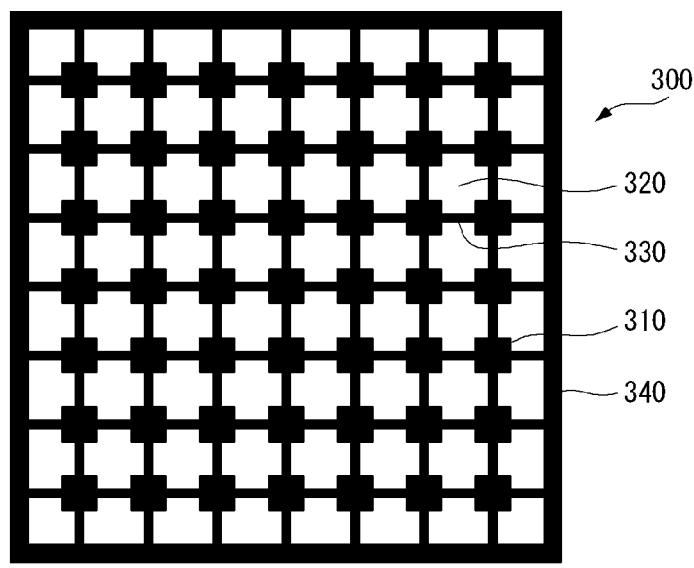
FIGS. 4A and 4B show examples of a mask according to an exemplary embodiment of the present invention.
Figure 4B:
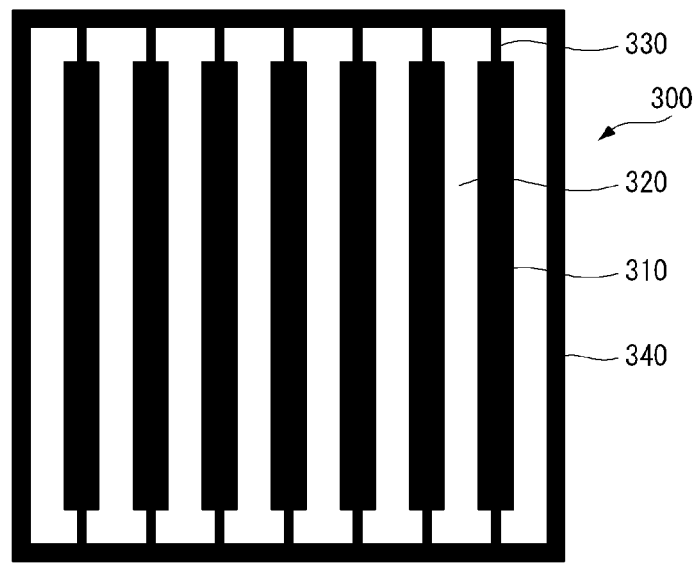

FIGS. 3A to 3F are cross-sectional views sequentially showing each of steps in a method for manufacturing a solar cell according to an exemplary embodiment of the present invention and FIGS. 4A and 4B show examples of a mask according to an exemplary embodiment of the present invention.

As shown in FIG. 3A, a texturing process is performed on an incident surface of a substrate 110 to form a textured surface for scattering light incident toward the incident surface and reducing a reflectance amount of the light.

When the substrate 110 is made of single crystal silicon, an anisotropy etching may be performed on the incident surface of the substrate 110 to form the textured surface. Since atoms are more densely arranged in a (111) surface than a (100) surface, an etching rate in the (111) surface is slower than that in the (100) surface. Thereby, in performing the anisotropy etching, a plurality of portions of pyramidal shapes are formed. The anisotropy etching is performed using a basic solution such as KOH and NaOH as an etching solution. The etching rate may be varied in accordance with components and a concentration of the etching solution, an etching temperature, and an etching time, etc.

When the substrate 110 is made of polycrystalline silicon, the textured surface may be formed by an isotropy etching using an acid solution as the etching solution. At this time, the etching solution for the isotropy etching may be HF or $HNO_3$, etc.

In an alternative embodiment, a mechanical manner using a diamond cutter, a laser beam, or a physical manner using plasma may be used for the texturing process to form the textured surface, instead of the anisotropy etching or the isotropy etching.

Next, as shown in FIG. 3B, a high temperature thermal process is performed on the substrate 110 in an environment containing a material (for example, $PH_3$ or $POCl_3$) including an impurity of a group V element such as P, As, and Sb, to diffuse the impurity of the group V element into the substrate 110 and to thereby form an emitter layer 120 on the entire surface of the substrate 110.

Unlike this embodiment, when the conductive type of the substrate 110 is an n-type, the thermal process is performed in the environment containing a material (for example, BN) including an impurity of a group III element, to form the emitter layer 120 of a p-type into the substrate 110. Then, phosphorous silicate glass (PSG) containing phosphor (P) or boron silicate glass (BSG) containing boron (B) produced when the p-type impurity or the n-type impurity is diffused inside the substrate 110 is removed through an etching process.

In an alternative embodiment, by using an ion implantation manner, the impurity of the group III or V element may be doped into the substrate 110. That is, by displacing the substrate 110 in a vacuum chamber and accelerating ions of the impurity toward the substrate 110, the impurity implants into the substrate 110 to form the emitter layer 120.

Next, as shown in FIG. 3C, a rear portion of the substrate 110 is removed by a wet etching or a dry etching, etc., to remove a portion of the emitter layer 120, which is formed on the rear surface of the substrate 110.

As shown in FIG. 3D, first and second anti-reflection layers 131 and 132 are sequentially formed on the emitter layer 120 of the substrate 110 to form an anti-reflection layer 130, and first to third passivation layers 191-193 are sequentially formed on the rear surface of the substrate 110 to form a passivation layer 190. The first and second anti-reflection layers 131 and 132 and the first to third passivation layer 191-193 are formed in a plurality of chambers 201-205 using a chemical vapor deposition (CVD) method such as a plasma enhanced chemical vapor deposition (PECVD) method, respectively.

That is, referring to FIG. 3D, five chambers 201-205 are sequentially disposed for forming each of the layers 131, 132 and 191-193. Thereby, when a formation of a desired layer is finished in a corresponding chamber 201-205, the substrate 110 is moved to the next chamber 201-205 for forming another of the layers 131, 132, and 191-193. At this time, a source gas supplied into each chamber 201-205 is changed in accordance with a desired layer.

In this embodiment, the first anti-reflection layer 131 is formed by silicon nitride (SiNx:H) and the second anti-reflection layer 132 is formed by silicon oxynitride (SiOxNy). The first passivation layer 191 is formed by silicon oxide (SiOx), the second passivation layer 191 is formed by silicon nitride (SiHx:H), and the third passivation layer 193 is formed by silicon oxynitride (SiOxNy). However, a material for each of the anti-reflection layers 131 and 132 and the passivation layers 191-193 may be varied.

The first and second anti-reflection layer 131 and 132 are formed on the entire exposed surface of the substrate 110, while the first to third passivation layers 191-193 include a plurality of exposed portions 181 that expose portions of a corresponding surface (for example, the rear surface) of the substrate 110.

Thus, after a mask 300 is disposed on the corresponding surface of the substrate 110, the first to third passivation layers 191-193 are formed using the CVD method.

As described above, whenever each passivation layer 191-193 is formed, the chamber 203-205 for performing the CVD method is changed. Thus, the substrate 110 is moved into a corresponding chamber 203-205 for forming each passivation layer 191-193. At this time, for forming the exposed portions 181, the same mask 300 is arranged into each camber 203-205.

Examples of the mask 300 according to the embodiment of the present invention are shown in FIGS. 4A and 4B.

An example of the mask 300 shown in FIG. 4A includes a plurality of blocking portions 310 and a plurality of openings 320, and further includes a plurality of connectors 330. The blocking portions 310 have approximately rectangular shape. The connectors 330 connect adjacent blocking portions 310 and connect the blocking portions 310 to a frame 340. Accordingly, each of the plurality of openings 320 is surrounded by adjacent blocking portions 310 and the connectors 330.

For sequentially forming the first to third passivation layers 191-193, after the mask 300 shown in FIG. 4A is arranged on the substrate 110 displaced in a corresponding chamber 203-205, a source gas is supplied into the chamber 203-205, and then the CVD method is subjected to the substrate 110.

Accordingly, the source gas passes through the plurality of openings 320 to be deposited on portions of the substrate 110, which correspond to the openings 320 and to thereby form the first to third passivation layers 191-193. At this time, since the source gas is blocked by the blocking portions 310 and the connectors 330, the source gas is not deposited on portions of the substrate 110, which correspond to the blocking portions 310 and the connectors 330 such that the plurality of exposed portions 181 are formed.

In forming the passivation layer 190 having the exposed portions 181 using the mask 300 shown in FIG. 4A, the passivation 190 includes a plurality of passivation islands corresponding to the openings 320 and the exposed portions 181 include portions corresponding to the blocking portions 310 and portions corresponding to the connectors 330.

Instead of the mask 300 shown in FIG. 4A, a mask 300 shown in FIG. 4B may be used to form the passivation layer 190 having the plurality of exposed portions 181.

Similar to the mask shown in FIG. 4A, the mask 300 shown in FIG. 4B includes a plurality of blocking portions 310 and a plurality of connectors 330 connecting the blocking portions 310 and a frame 340. However, unlike that shown in FIG. 4A, each of the blocking portions 310 has a stripe shape.

Thereby, in forming the passivation layer 190 having the exposed portions 181 by using the mask 300, the exposed portions 181 have a pseudo stripe shape corresponding to the blocking portions 310 and the connectors 330.

The masks 300 shown in FIGS. 4A and 4B are only examples. Accordingly, by varying a shape of the mask 300, the various passivation layers 190 having the exposed portions of various shapes may be formed.

In this embodiment, the anti-reflection layer 130 of a double-layered structure and the passivation layer 190 of a triple-layered structure are sequentially formed into the five sequential chambers 201-205 by the CVD method, and further the same mask 300 is used for forming the exposed portions 181 in the passivation 190 whenever each of the passivation layers 191-193 is formed. Thereby, layer formation processes are simplified and a layer formation time is reduced.

That is, the anti-reflection layer 130 and the passivation layer 190 are formed into one chamber in a prior art. Thus, for forming one layer, the substrate 110 is moved into the one chamber and a layer formation process is performed, and then the substrate 110 is taken out from the chamber. Next, after an environment of the chamber is adjusted to prepare the next layer formation process, the substrate 100 is again disposed into the chamber to perform the next layer formation process. As a result, since whenever the layer is formed, the input and output operations of the substrate 110 are performed and the environment of the chamber is adjusted, a large layer formation time is required. Further, since various layers having different characteristics are formed into one chamber, the quality of the formed layers is deteriorated.

In addition, an etching paste is applied on corresponding portions of the passivation layer 190 formed through the above described processes and is dried, to form the exposed portions 181 in the corresponding portions of the passivation layer 190. When the exposed portions 181 are formed using the etching paste, an additional process such as a wet etching for removing the etching paste existing on the passivation layer 190 is necessary.

However, in this embodiment, since the number of the plurality of chambers is equal to that of the formed layers, the substrate 110 is sequentially moved into the chambers 201-205 according to an order of layer formation to form the layers 131, 132, and 191-193. Accordingly, whenever the layers 131, 132, and 191-193 are formed, it is not necessary to adjust the environment of the chambers 201-205 and to move the substrate 110 into the corresponding chamber 201-205, and thereby a layer formation time is reduced. Further, since each of the layers 131, 132, and 191-193 is formed into a separated chamber, the quality of the formed layers is improved.

In addition, when the substrate 110 is moved into the corresponding chamber 203-205 for forming the passivation layers 191-193, the mask 300 is also moved to form the passivation layers 191-193 having the same patterns as each other. Thus, since for forming the exposed portions 181 in the first to third passivation layers 191-193, an additional process is not necessary, the layer formation time is more reduced.

Next, as shown in FIG. 3E, a paste containing Ag is applied on corresponding portions of the second anti-reflection layer 132 of the anti-reflection layer 130 using a screen printing method and then is dried to form a front electrode and front electrode current collector pattern 140. The front electrode and front electrode current collector pattern 140 includes front electrode patterns and front electrode current collector patterns that extend in directions intersecting each other, respectively. In the embodiment, a width of the front electrode current collector pattern may be greater than a width of the front electrode pattern. A width relationship between the front electrode current collector pattern and the front electrode pattern may be varied.

Next, as shown in FIG. 3F, a paste containing Al is applied on the third passivation layer 193 and portions of substrate 110 exposed through the exposed portions 181 using the screen printing method and then is dried to form a rear electrode conductive layer pattern 150.

At this time, a formation order of the patterns 140 and 150 may vary.

Next, a firing process is performed on the substrate 110, on which the front electrode and front electrode current collector pattern 140 and the rear electrode conductive layer pattern 150 are formed. That is, one thermal process is performed on the substrate 110, to form a plurality of front electrodes 141, a plurality of front electrode current collectors 142, a rear electrode conductive layer 155 including a plurality of rear electrodes 151 electrically connected to the portions of the substrate 110 exposed through the exposed portions 181, and a plurality of BSFs 171. As a result, the solar cell 1 shown in FIGS. 1 and 2 is completed.

More specifically, when the thermal process is performed, due to an element such as Pb contained in the front electrode and front electrode current collector pattern 140, the front electrode and front electrode current collector pattern 140 sequentially passes through the contacted portions with the second anti-reflection layer 132 and the first underlying anti-reflection layer 131 and makes contact with the emitter layer 120, to form a plurality of front electrodes 141 and a plurality of front electrode current collectors 142. Thereby, a thickness of each of the first electrodes 141 and the front electrode current collectors is equal to or larger than a sum of thickness of the first and second anti-reflection layers 131 and 132.

Further, as shown in FIGS. 1 and 2, during the thermal process, Al contained in the rear electrode pattern 150 is diffused to the substrate 110 contacting the rear electrode pattern 150 to form the plurality of BSFs 171 between the rear electrodes 151 and the substrate 110. In this case, the BSFs 171 are an area doped with an impurity of the same conductive type as the substrate 110, for example, a p-type impurity. An impurity doping concentration of the BSFs 171 is greater than an impurity doping concentration of the substrate 110, and thus the BSFs 171 are a p+-type area. In addition, metal components contained in the respective patterns 140 and 150 chemically coupled with layers 120 and 110 contacting the patters 140 and 150, respectively, such that contact resistance decreases and thereby a current flowing is improved.

In embodiments of the invention, reference to front or back, with respect to electrode, a surface of the substrate, or others is not limiting. For example, such a reference is for convenience of description since front or back is easily understood as examples of first or second of the electrode, the surface of the substrate or others.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method for manufacturing a solar cell comprising:
    forming an emitter layer of a second conductive type opposite a first conductive type on a substrate of the first conductive type;
    sequentially positioning the substrate in a plurality of chambers to form an anti-reflection layer on the emitter layer and to form a passivation layer including at least one exposed portion on a rear surface of the substrate opposite an incident surface of the substrate;
    coating a first paste on the anti-reflection layer to form a first electrode pattern;
    coating a second paste on the passivation layer and on a portion of the substrate exposed by the exposed portion to form a second electrode conductive layer pattern; and
    performing a thermal process on the substrate having the first electrode pattern and the second electrode conductive layer pattern to form a plurality of first electrodes electrically connected to the emitter layer and to form a second electrode conductive layer including at least one second electrode electrically connected to the substrate,
    wherein a number of chambers is equal to a sum of a number of layers constituting the anti-reflection layer and a number of layers constituting the passivation layer,
    wherein a different source gas is injected into each of the plurality of chambers,
    wherein the passivation layer includes first, second, and third passivation layers each having a different refractive index,
    wherein the forming of the anti-reflection layer and the passivation layer comprises independently performing a layer formation process in each of the plurality of chambers,
    wherein the forming of the anti-reflection layer and the passivation layer comprises positioning a mask including at least one opening and at least one blocking portion on the substrate and performing the layer formation process on the substrate using the mask to form the first, second, and third passivation layers, and
    wherein the same mask is used to form the first, second, and third passivation layers.

2. The method of claim 1, wherein the anti-reflection layer includes first and second anti-reflection layers each having a different refractive index.

3. The method of claim 2, wherein the first anti-reflection layer is formed of silicon nitride (SiNx:H), and the second anti-reflection layer is formed of silicon oxynitride (SiOxNy).

4. The method of claim 1, wherein the first passivation layer positioned closest to the substrate has a maximum refractive index, and the third passivation layer positioned farthest away from the substrate has a minimum refractive index.

5. The method of claim 4, wherein the first passivation layer is formed of silicon oxide (SiOX), the second passivation layer is formed of silicon nitride (SiNx:H), and the third passivation layer is formed of silicon oxynitride (SiOxNy).

6. The method of claim 1, wherein the layer formation process uses a chemical vapor deposition (CVD) method.

* * * * *